(12) United States Patent
Tsai et al.

(10) Patent No.: US 9,530,871 B1
(45) Date of Patent: Dec. 27, 2016

(54) METHOD FOR FABRICATING A SEMICONDUCTOR DEVICE

(71) Applicant: UNITED MICROELECTRONICS CORP., Hsin-Chu (TW)

(72) Inventors: Ming-Yueh Tsai, Taichung (TW); Jia-Feng Fang, Changhua County (TW); Yi-Wei Chen, Taichung (TW); Jing-Yin Jhang, Tainan (TW); Rung-Yuan Lee, New Taipei (TW); Chen-Yi Weng, New Taipei (TW); Wei-Jen Wu, Tainan (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 0 days.

(21) Appl. No.: 15/225,836

(22) Filed: Aug. 2, 2016

Related U.S. Application Data

(62) Division of application No. 14/940,120, filed on Nov. 12, 2015, now Pat. No. 9,443,757.

(30) Foreign Application Priority Data

Oct. 7, 2015 (TW) .............................. 104132947 A

(51) Int. Cl.
*H01L 21/8232* (2006.01)
*H01L 29/66* (2006.01)
*H01L 21/02* (2006.01)
*H01L 21/324* (2006.01)

(52) U.S. Cl.
CPC ..... *H01L 29/66795* (2013.01); *H01L 21/0214* (2013.01); *H01L 21/02126* (2013.01); *H01L 21/02164* (2013.01); *H01L 21/324* (2013.01)

(58) Field of Classification Search
CPC ....................... H01L 21/823431; H01L 29/785
See application file for complete search history.

(56) References Cited

U.S. PATENT DOCUMENTS

| 9,159,794 | B2 | 10/2015 | Yu |
| 9,385,212 | B2* | 7/2016 | Yin .................. H01L 29/66795 |
| 2013/0105912 | A1 | 5/2013 | Hsu et al. |

* cited by examiner

*Primary Examiner* — Mark Prenty
(74) *Attorney, Agent, or Firm* — Winston Hsu; Scott Margo

(57) ABSTRACT

A method for fabricating semiconductor device is disclosed. The method includes the steps of: providing a substrate having a fin-shaped structure thereon; forming an epitaxial layer on the fin-shaped structure; forming a first contact etch stop layer (CESL) on the epitaxial layer; forming a source/drain region in the epitaxial layer; and forming a second CESL on the first CESL.

9 Claims, 3 Drawing Sheets

METHOD FOR FABRICATING A SEMICONDUCTOR DEVICE

CROSS REFERENCE TO RELATED APPLICATIONS

This application is a division of U.S. application Ser. No. 14/940,120 filed Nov. 12, 2015, and incorporated herein by reference in its entirety.

BACKGROUND OF THE INVENTION

1. Field of the Invention

The invention relates to a method for fabricating semiconductor device, and more particularly, to a method of forming a first contact etch stop layer (CESL), a cap layer, and a second CESL on an epitaxial layer.

2. Description of the Prior Art

With the trend in the industry being towards scaling down the size of the metal oxide semiconductor transistors (MOS), three-dimensional or non-planar transistor technology, such as fin field effect transistor technology (FinFET) has been developed to replace planar MOS transistors. Since the three-dimensional structure of a FinFET increases the overlapping area between the gate and the fin-shaped structure of the silicon substrate, the channel region can therefore be more effectively controlled. This way, the drain-induced barrier lowering (DIBL) effect and the short channel effect are reduced. The channel region is also longer for an equivalent gate length, thus the current between the source and the drain is increased. In addition, the threshold voltage of the FinFET can be controlled by adjusting the work function of the gate.

However, numerous problems still arise from the integration of fin-shaped structure and epitaxial layer in today's FinFET fabrication and affect current leakage and overall performance of the device. Hence, how to improve the current FinFET process has become an important task in this field.

SUMMARY OF THE INVENTION

According to a preferred embodiment of the present invention, a method for fabricating semiconductor device is disclosed. The method includes the steps of: providing a substrate having a fin-shaped structure thereon; forming an epitaxial layer on the fin-shaped structure; forming a first contact etch stop layer (CESL) on the epitaxial layer; forming a source/drain region in the epitaxial layer; and forming a second CESL on the first CESL.

According to another aspect of the present invention, a semiconductor device is disclosed. The semiconductor device includes: a substrate having a fin-shaped structure thereon; an epitaxial layer on the fin-shaped structure; a first CESL on the epitaxial layer and the substrate; a first cap layer on the first CESL; and a second CESL on the first cap layer.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
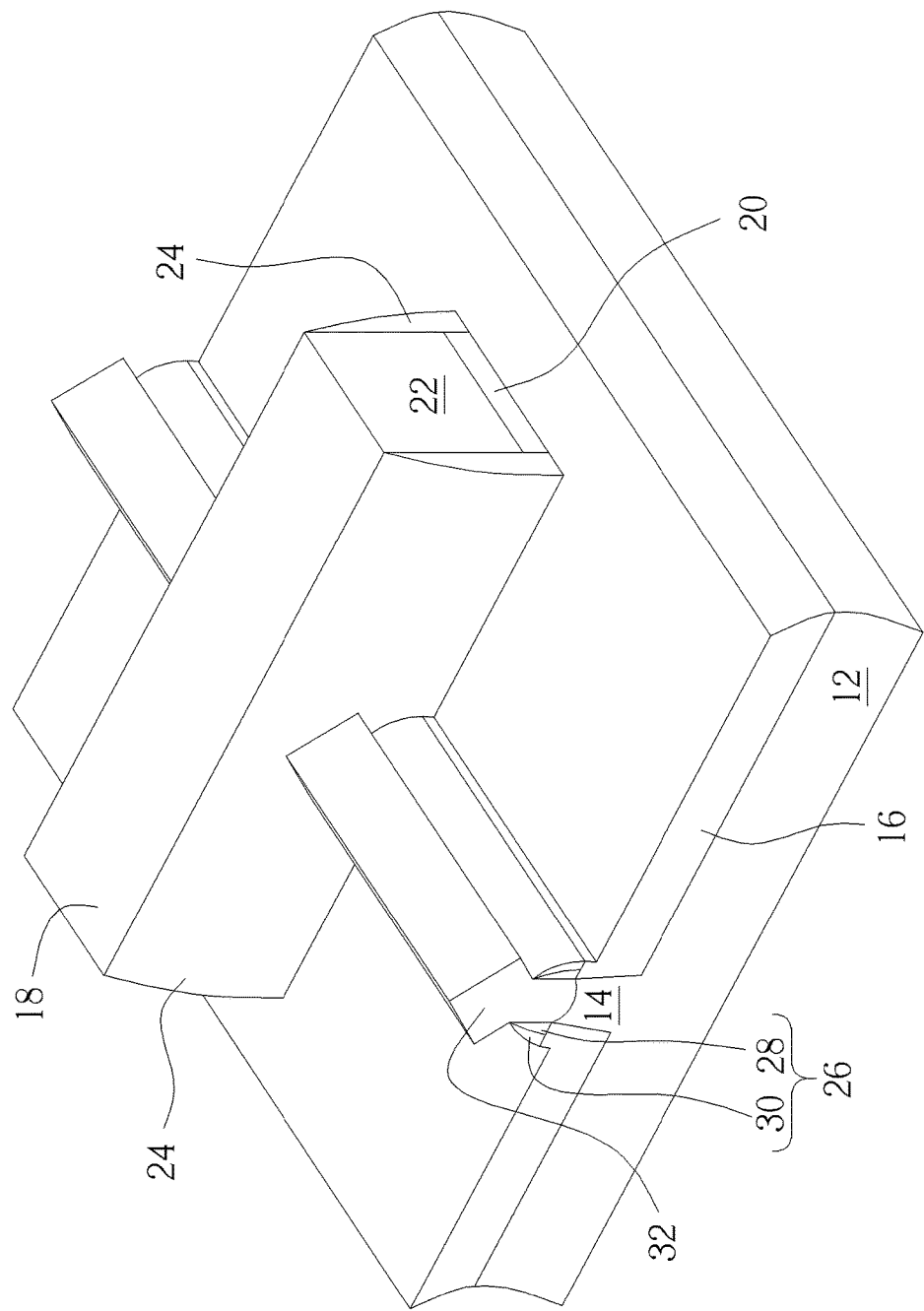
FIGS. 1-2 illustrate a method for fabricating semiconductor device according to a preferred embodiment of the present invention.
Figure 2:
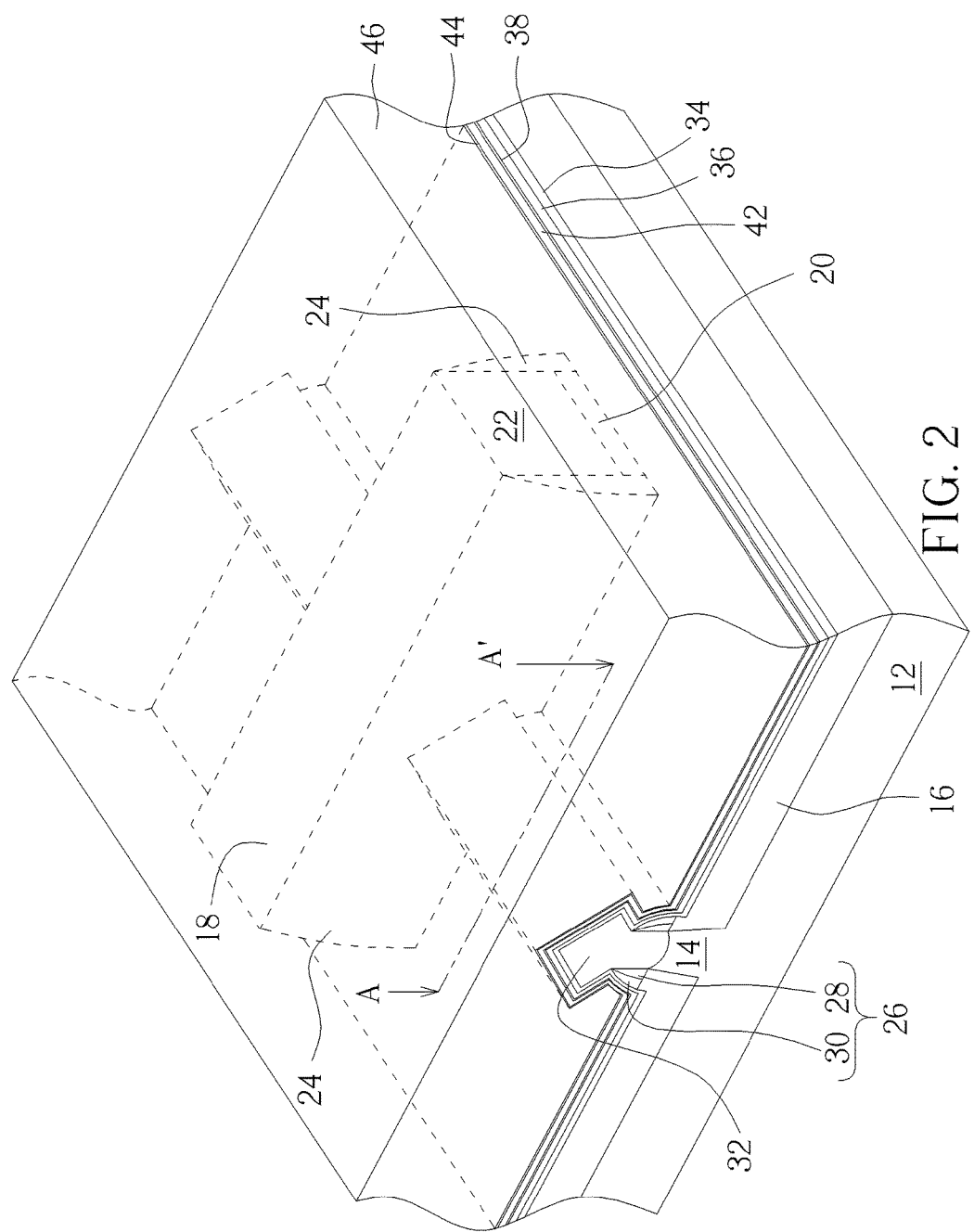

Referring to FIGS. 1-2, FIGS. 1-2 illustrate a method for fabricating semiconductor device according to a preferred embodiment of the present invention. As shown in FIG. 1, a substrate 12, such as a silicon substrate or silicon-on-insulator (SOI) substrate is provided, and a transistor region, such as NMOS region is defined on the substrate 12. At least a fin-shaped structure 14 and an insulating layer (not shown) are formed on the substrate 12, in which the bottom of the fin-shaped structure 14 is preferably enclosed by the insulating layer, such as silicon oxide to form a shallow trench isolation (STI) 16, and a dummy gate or gate structure 18 is formed on part of the fin-shaped structure 14.

The formation of the fin-shaped structure 14 could be accomplished by first forming a patterned mask (now shown) on the substrate, 12, and an etching process is performed to transfer the pattern of the patterned mask to the substrate 12. Next, depending on the structural difference of a tri-gate transistor or dual-gate fin-shaped transistor being fabricated, the patterned mask could be stripped selectively or retained, and deposition, chemical mechanical polishing (CMP), and etching back processes are carried out to form an insulating layer surrounding the bottom of the fin-shaped structure 14. Alternatively, the formation of the fin-shaped structure 14 could be accomplished by first forming a patterned hard mask (not shown) on the substrate 12, and then performing an epitaxial process on the exposed substrate 12 through the patterned hard mask to grow a semiconductor layer. This semiconductor layer could then be used as the corresponding fin-shaped structure 14, the patterned hard mask could be removed selectively or retained, and deposition, CMP, and then etching back could be used to form a STI surrounding the bottom of the fin-shaped structure 14. In another fashion, if the substrate 12 were a SOI substrate, a patterned mask could be used to etch a semiconductor layer on the substrate until reaching a bottom oxide layer underneath the semiconductor layer to form the corresponding fin-shaped structure. If this means is chosen the aforementioned steps for fabricating the STI could be eliminated.

The formation of the gate structure 18 could be accomplished by a gate first process, a high-k first approach from gate last process, or a high-k last approach from gate last process. Since this embodiment pertains to a high-k last approach, a gate structure 18 composed of interfacial layer 20 and polysilicon gate 22 is formed on the fin-shaped structure 14, a spacer 24 is formed on sidewalls of the gate structure 18 and another spacer 26 is formed adjacent to the sidewalls of the fin-shaped structure 14. In this embodiment, each of the spacers 24 and 26 could be a composite spacer, such as a spacer further including a spacer 28 and another spacer 30, in which the spacer 28 could be composed of SiCN and the spacer 30 could be composed of SiN, but not limited thereto.

Next, part of the fin-shaped structure 14 is removed and an epitaxial growth process is conducted to form an epitaxial layer 32 on the fin-shaped structure 14 adjacent to two sides of the gate structure 18. Depending on the type of device being fabricated, the epitaxial layer 32 could be composed of SiGe, SiC, or SiP, but not limited thereto.

Figure 3:
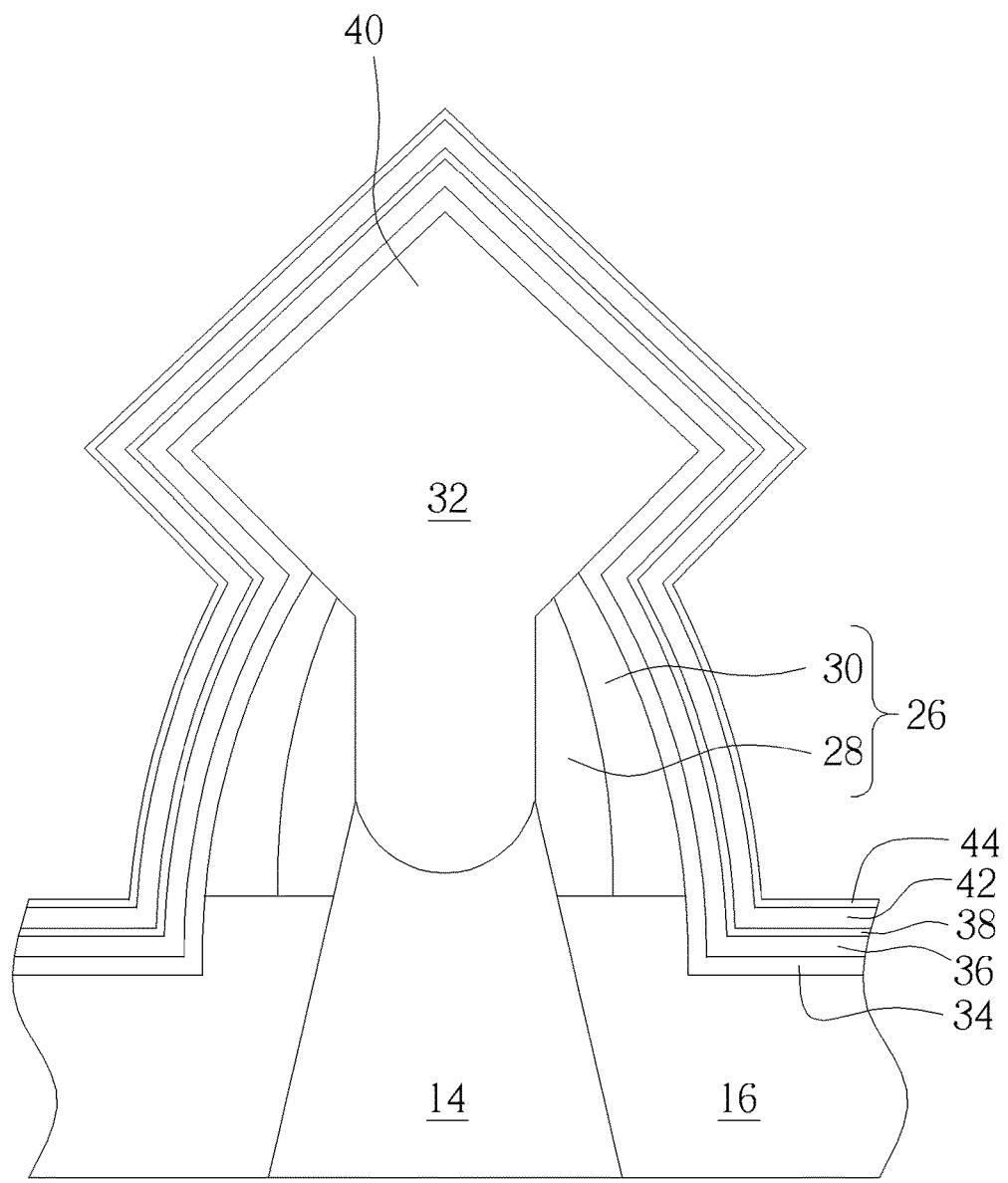
FIG. 3 illustrates a cross-sectional view of FIG. 2 along the sectional line AA'.

Referring to FIGS. 2-3, FIG. 3 illustrates a cross-sectional view of FIG. 2 along the sectional line AA'. As shown in FIGS. 2-3, a cap layer 34 is formed to cover the epitaxial layer 32, STI 16, and fin-shaped structure 14, and a first CESL 36 and another cap layer 38 are deposited on the cap layer 34. In this embodiment, the cap layer 34 preferably includes SiO$_2$, the first CESL 36 preferably includes SiCN or SiN, and the cap layer 38 preferably includes SiON or SiCON, but not limited thereto. It should be noted that since the cap layer 38 is formed on the first CESL 36 through oxidation process, the cap layer 38 would be composed of SiCON if the first CESL 36 is composed of SiCN, or the cap layer 38 would be composed of SiON if the first CESL 36 is composed of SiN.

Next, depending on the type of device being fabricated, an ion implantation process is conducted to implant n-type or p-type dopants into the epitaxial layer 32 adjacent to two sides of the gate structure 18, and an anneal process is conducted to activate the implanted dopants for forming a source/drain region 40. In this embodiment, the anneal process preferably includes a laser anneal process, but not limited thereto. Next, a second CESL 42 is formed on the cap layer 38, and another cap layer 44 is selectively formed on the surface of the second CESL 42. Similar to the aforementioned cap layer 38, the cap layer 44 could be formed on the second CESL 42 through an oxidation process, such that the cap layer 44 would be composed of SiCON if the second CESL 42 is composed of SiCN, or the cap layer 44 would be composed of SiON if the second CESL 42 is composed of SiN.

In this embodiment, the first CESL 36 and second CESL 42 preferably share same thickness, in which the thickness of each of the first CESL 36 and second CESL 42 is approximately between 15 Angstroms to 25 Angstroms, or most preferably at 20 Angstroms. Moreover, the first CESL 36 and second CESL 42 also share same material, such that both layers 36 and 42 are selected from the group consisting of SiCN and SiN. This completes the fabrication of a semiconductor device according to a preferred embodiment of the present invention. Next, typical FinFET fabrication process could be carried out by forming an interlayer dielectric (ILD) layer 46 on the substrate 12 to cover the gate structure 18, and then conducting a replacement metal gate (RMG) process to transform the gate structure 18 into metal gate. Since the RMG process is well known to those skilled in the art, the details of which are not explained herein for the sake of brevity.

Referring to FIG. 3, FIG. 3 illustrates a structural view of a semiconductor device according to a preferred embodiment of the present invention. As shown in FIG. 3, the semiconductor device of the present invention includes a substrate 12, a fin-shaped structure 14 on the substrate 12, an epitaxial layer 32 on the fin-shaped structure 14, a spacer 26 adjacent to the epitaxial layer 32 and fin-shaped structure 14, a cap layer 34 on the epitaxial layer 32, spacer 26, and STI 16, a first CESL 36 on the cap layer 34, a cap layer 38 on the first CESL 36, a second CESL 42 on the cap layer 38, and a cap layer 44 on the second CESL 42.

In this embodiment, the material of the cap layer 34 is preferably different from the material of the cap layer 38 and cap layer 44. As stated previously, the cap layer 34 is preferably composed of SiO$_2$ while the material of the cap layers 38 and 44 could differ depending on the material of the first CESL 36 and second CESL 42 underneath. For instance, if the first CESL 36 is composed of SiCN, the cap layer 38 is preferably composed of SiCON, whereas if the first CESL 36 is composed of SiN, the cap layer 38 is preferably composed of SiON. Similarly, if the second CESL 42 is composed of SiCN, the cap layer 44 is preferably composed of SiCON, or if the second CESL 42 is composed of SiN, the cap layer 44 is preferably composed of SiON. In addition, the first CESL 36 and second CESL 42 preferably share same material and same thickness, and the cap layer 38 is disposed between the first CESL 36 and second CESL 42 so that these two layers 36 and 42 do not contact each other. Moreover, the first CESL 36 and second CESL 42 could have different stress depending on the demand of the product, which is also within the scope of the present invention.

Typically, a cap layer composed of silicon oxide is deposited on the fin-shaped structure, substrate, and gate structure before source/drain region is formed in conventional process, in which the cap layer preferably serves as a buffer layer for ion implantation carried out for forming the source/drain region. After the source/drain region is formed, cleaning agent such as diluted hydrofluoric acid (dHF) is used to remove the cap layer composed of silicon oxide, and a CESL is formed thereafter. Since the cleaning process using aforementioned dHF to remove the cap layer easily damages the surface of epitaxial layer and affect the performance and operation of the device, the present invention preferably forms a first CESL on the epitaxial layer and gate structure after formation of gate structure and epitaxial layer and before formation of source/drain region, conducts an ion implantation process to form source/drain region, and then forms a second CESL on the first CESL.

In other words, the conventional CESL formation step is divided into two parts, in which the first part of CESL (or the aforementioned first CESL) could be used to replace the aforementioned silicon oxide cap layer, so that the cleaning process using agent such as dHF could be eliminated and damage to the surface of epitaxial layer by the cleaning agent is prevented.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating semiconductor device, comprising:
   providing a substrate having a fin-shaped structure thereon;
   forming an epitaxial layer on the fin-shaped structure;
   forming a first contact etch stop layer (CESL) on the epitaxial layer;
   forming a source/drain region in the epitaxial layer; and
   forming a second CESL after forming the source/drain region.

2. The method of claim 1, further comprising a shallow trench isolation (STI) around the fin-shaped structure, the method comprises:
   forming a spacer adjacent to the fin-shaped structure;
   removing part of the fin-shaped structure;
   forming the epitaxial layer on the fin-shaped structure;
   forming the first CESL on the epitaxial layer, the spacer, and the STI;
   forming a first cap layer on the first CESL;
   forming the source/drain region in the epitaxial layer; and
   forming the second CESL on the first cap layer.

3. The method of claim 2, wherein the first cap layer comprises SiON or SiCON.

4. The method of claim 2, further comprising forming a second cap layer on the epitaxial layer before forming the first CESL.

5. The method of claim 4, wherein the second cap layer comprises $SiO_2$.

6. The method of claim 1, wherein the first CESL and the second CESL comprise same material.

7. The method of claim 1, wherein the first CESL and the second CESL comprise SiCN or SiN.

8. The method of claim 1, wherein the first CESL and the second CESL comprise same thickness.

9. The method of claim 1, further comprising performing an anneal process after forming the source/drain region and before forming the second CESL.

* * * * *